June 30, 1970 R. F. RUTZ 3,518,574

INJECTION LASER DEVICE

Filed May 1, 1964 2 Sheets-Sheet 1

INVENTOR

RICHARD F. RUTZ

BY Alvin J. Riddles

ATTORNEY

United States Patent Office 3,518,574

Patented June 30, 1970

3,518,574

INJECTION LASER DEVICE

Richard F. Rutz, Cold Spring, N.Y., assignor to International Business Machines Corporation, New York, N.Y., a corporation of New York Filed May 1, 1964, Ser. No. 364,194
Int. Cl. H01s *3/18*
U.S. Cl. 332—7.51 10 Claims

ABSTRACT OF THE DISCLOSURE

The GaAs injection laser has a continuous P-N junction. One contact is made to the P region and two or more individual contacts to electrically isolated portions of the N region. The P region is at one potential and opposite polarity signals are applied to the N region contacts. A negative signal applied to an N region contact forward biases the junction and can produce lasing along the junction. The operation is modulated by applying a positive signal to another one or more of the N region contacts to reverse bias the junction in the vicinity of those contacts.

This invention relates to the control of light emitted from electro-optical devices, wherein light is produced by injection and recombination of carriers in a semiconductor material and in particular, to the intensity and directional control of light output by control of the portion of the solid state device in which carriers are injected.

Solid state electro-optical devices such as the Injection Laser, wherein light is produced by the injection and subsequent recombinations of carriers in a semiconductor material, have a number of advantages in simplicity of operation; however, these devices require very high current densities which have limited their physical size and, as a result, control of the light output of such devices has been difficult.

It has been discovered that an improved degree of control of light output can be imparted to a solid state electro-optical device by providing, in a semiconductor material capable of both radiating and absorbing light under different injected carrier densities, a PN junction capable of a varying bias across its face. This is accomplished in accordance with the invention by constructing a solid state electro-optical device containing a PN junction so that the resistivity on one side of the junction is sufficiently low or is dimensionally thin and coated with a high conductance metal that the entire region is made essentially unipotential regardless of current density, and the region of the opposite conductivity type on the other side of the junction is permitted to exhibit a resistance to current flow parallel to the junction. These structural features permit the bias across the junction to be varied over its physical surface area so that selective portions of the junction can be permitted to inject and absorb carriers during operation of the device.

It is an object of this invention to provide an improved injected carrier electro-optical device.

It is an object of this invention to provide an improved injection laser.

It is another object of this invention to provide a method of directionally controlling the light output of injected carrier electro-optical devices.

It is another object of this invention to provide a method of directionally controlling the output of an injection laser.

The foregoing and other objects, features, and advantages of the invention will be apparent from the following more particular description of a preferred embodiment of the invention, as illustrated in the accompanying drawings.

Figure 1:
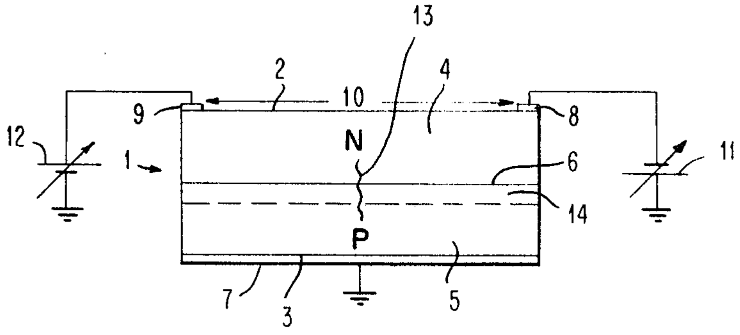
FIG. 1 is a schematic view of a semiconductor structure illustrating the principles of the invention.

A structure embodying the principles of this invention will have a body of semiconductor material capable of varying from absorption to radiation of light dependent on the injected carrier concentration, will have a PN junction within the structure for carrier injection and will have means to controllably limit the region of the injection of that PN junction by virtue of a variable bias over the surface of the PN junction enabled by the resistivity properties of the semiconductor material and the potentials applied. These principles may be seen in connection with FIG. 1, wherein a side view of a semiconductor body 1 is shown in wafer form having a first major surface 2 and a second major surface 3. The body 1 contains an N region 4 and a P region 5 separated by a PN junction 6. The plane of the PN junction 6 is essentially parallel to the surfaces 2 and 3 of the wafer. The P region 5 is constructed to be essentially unipotential during current flow. This structural feature may be imparted in several ways, the relationship of which will be described hereinafter. In this illustration unipotentially is imparted by a broad area contact 7 made to the P region 5, for example, by a coating with an ohmic material such as solder. The N region 4 is constructed to exhibit a difference in potential with respect to the P region 5 by employing the resistivity thereof together with individual ohmic connections and 8 and 9, which are separated a distance identified as 10. A first source of one polarity potential 11 is shown connected between a reference potential and the ohmic contact 8, and a second source of opposite polarity potential 12 is shown connected between reference potential and ohmic contact 9. The potential sources 11 and 12 are shown variable to illustrate the control imparted by the invention. The ohmic contact 7 is shown connected to the reference potential. Under the conditions illustrated in FIG. 1, a variation of potential will appear in the N region 4 along the distance 10 between the contacts 8 and 9 while the P region by virtue of its ohmic contact 7 on surface 3 will be essentially unipotential. This combination of structural features will provide a difference in bias across the area of the junction 6 and that difference has been illustrated in the potential polarities shown as dividing the junction 6 at an imaginary equipotential point 13 into a portion with forward bias between the ohmic contact 8 and the point 13 and a reverse biased portion between the ohmic contact 9 and the point 13. The control of the carrier injecting area of a PN junction permits selectivity in both intensity of the light output of the device of FIG. 1, but also, as may be seen in connection with the following illustrations, the portion of the PN junction 6 area used for directionality of light output may be controlled. It has been found in accordance with the invention, that PN junctions which do not provide sufficient injected carriers tend to actually absorb the recombination radiated energy so that the combined effect of the constructed varying bias coupled with the absorptive properties of the semiconductor material operate to provide a valuable measure of control to those devices not heretofore available.

Referring again to the device of FIG. 1, the principles of the invention are particularly valuable where the device is an injection laser. In such a device, the current flowing between the N region 4 and the P region 5 results in the setting up of an optical cavity containing a standing wave shown dotted as element 14. The cavity 14 is equipped with properties that serve the function of the well known Fabry-Perot interferometer. These may be reflecting plates on the ends or cleaved surfaces well known in the art. In operation stimulated emission light emerges in a path parallel to the area of the junction and perpendicular to the Fabry-Perot reflecting plates or cleaved faces and reaches a utilization device not shown. It will be apparent under these conditions, that since the light energy is absorbed by the portion of the PN junction 6 not having a sufficient forward bias, the movement of the equipotential point 13 can control not only the threshhold of stimulated emission, but also, as will be further described in connection with the area of the PN junction 6 the directionality of the resulting light output.

In accordance with the invention, it is essential only that the structure embodying the invention be equipped with a carrier injecting junction with means to establish an essentially unipotential region on the one side of the junction and further means to provide a difference of potential between a plurality of ohmic contacts on the other side of the junction. For purposes of carrier injection efficiency and carrier population establishment the device body 1 is advantageously of monocrystalline semiconductor material with a high radiation efficiency and the junction is usually a PN junction 6 with the higher resistivity in the N region 4.

The structural requirements of the invention may be achieved in several ways, some of which are illustrated in the accompanying figures wherein the same reference numerals are employed for like elements.

Figure 2:
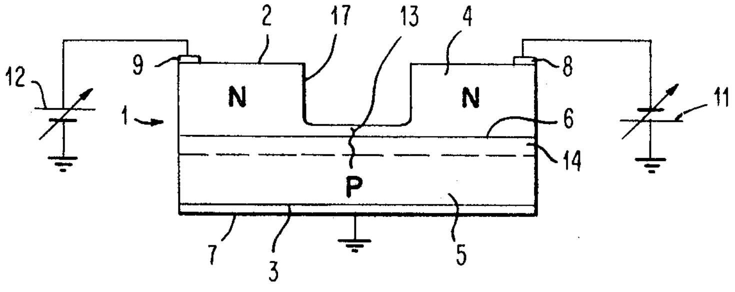
FIG. 2 illustrates imparting the structural features of the invention through physical removal of a portion of the structure.

Referring next to FIG. 2, in order to relax the dimensional requirement 10, a portion 17 of the N region 4 has been physically removed. In such a structure, the removal of the physical material, since it decreases the cross section of the N region 4 between the upper surface 2 and the PN junction 6, will result in a increased resistance between the contacts 8 and 9. Where the device of FIG. 2 is an Injection Laser, it will be apparent that the removed region 17 will best be taken from the portion of the body 1 that does not include the stimulated emission cavity 14. This cavity 14 is shown for illustration purposes as lying within the P region 5. For practical fabrication purposes, it is considered easier to remove the portion 17 on the side opposite to the cavity 14 and to arrange the structure so that the unipotenial side 5 is the one containing the stimulated emission cavity 14.

Figure 3:
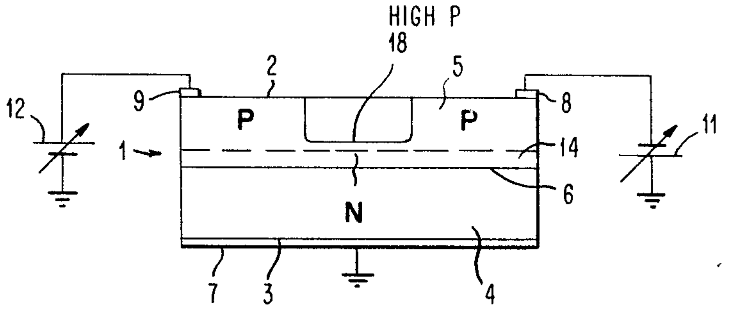
FIG. 3 illustrates imparting the structural features of the invention through changing of the characteristics of a portion of the structure.

Referring next to FIG. 3, the principle of the invention of resistance between the ohmic contacts is increased by the conversion of a portion 18 of the P region 5 to either high resistivity semiconductor material as shown or to opposite conductivity type. The conversion of a portion 18 of the region 4 may be accomplished through removal by etching and subsequently epitaxial deposition or by a controlled area diffusion operation through the surface 2. In the structure of FIG. 3, where the device is employed as an injection laser, the difference in resistivity is shown in the side containing the stimulated emission region 14. In this instance, the depth of the diffusion or of the conversion of the semiconductor material is shown to the boundary of the optical cavity region. Since the conductivity type of the semiconductor material is governed by the predominance of one type of impurity over another and the resistivity is governed by the net quantity of one type over another taking into account the mobility differences of the carriers, any mechanism that will disturb either the predominance or the net quantity will change the resistance between the ohmic contacts.

Figure 4:
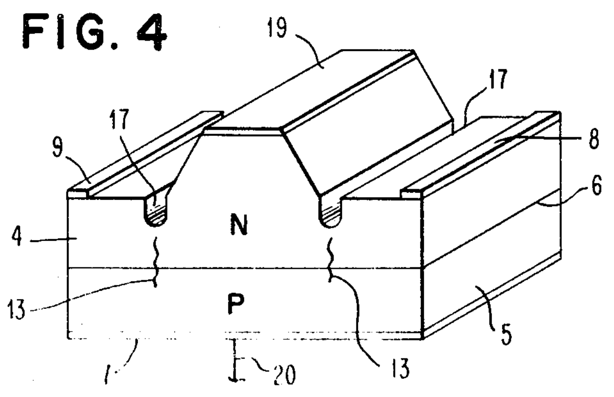
FIG. 4 is an illustration of another structure embodying the principles of the invention.

Referring next FIG. 4, a variation in structure is provided to further illustrate the application of the principles of the invention. In the structure of FIG. 4, the P region 5 is constructed to be unipotential by having the ohmic contact 7 applied over the entire surface area. The ohmic contacts 8 and 9 are constructed along the edges of the body and the main current for device operation purposes is introduced between contacts 19 and 20. The contacts 8 and 9 can be further separated by a channel such as 17 in FIG. 2. The device of FIG. 4 when serving an injection laser is equipped for stimulated emission and Fabry-Perot or other suitable type optical cavity reflecting features not shown are applied. These may be merely the reflectivity of cleaved or polished parallel ends due to index of refraction difference between the semiconductor and the surrounding medium or externally applied properly insulated metallic mirrors. In this structure, the central portion of the PN junction 6 under contact 19 is forward biased under heavy current. A reference bias or a difference in potential may be applied between contacts 8 and 9 which in accordance with the invention, operates at the edges to absorb beyond the points 13, radiation towards the sides and to suppress walking, transverse or other undesired internal modes in the stimulated emission cavity. It will be apparent to one skilled in the art that such a structure electronically accomplishes many of the cavity dimensional control requirements currently accomplished by sawing, etching, etc.

For a given forward current between contracts 19 and 20, an effective cavity dimension is controllable by the potential applied between contacts 8 and 9 and the threshhold for lasing can be approached or suppressed, depending on the combination of the current between contacts 19 and 20 and applied signals to contacts 8 and 9. It will then be apparent to one skilled in the art that such logical connections as AND and OR may be readily provided.

Figure 5:
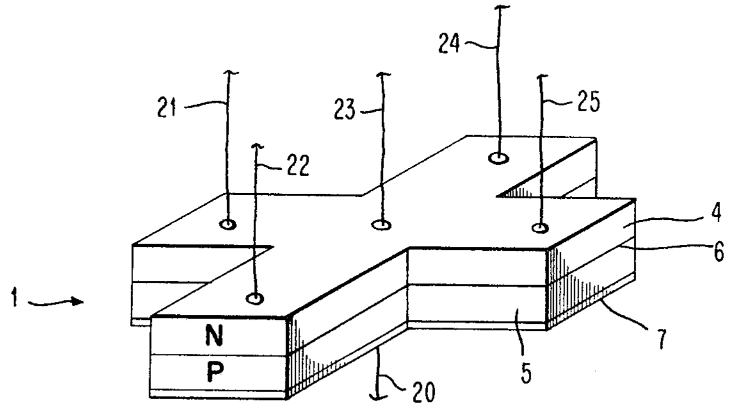
FIG. 5 is an illustration of a directional light output structure embodying the principles of the invention.

Referring next to FIG. 5, the principles of the invention are employed to provide selectivity of direction of light output. The structure of FIG. 5 employs a plurality of ohmic contacts 21–25 between each of which a difference of potential may be realized. The device of FIG. 5 can be caused to provide stimulated emission by either adding currents through groups of contacts such as 21, 23 and 25 to a point where losses are overcome or by introducing current at one terminal such as 23 and tuning the cavity under contacts 21, 23 and 25 by appropriate reverse biasing of the portion PN junction 6 under contacts 22 and 24. Stimulated emission of radiation will then occur in the arms of the device along contacts 21, 23 and 25 whereas there will be absorption in the arms of the device along contacts 22 and 24. It will thus be apparent that the direction of light output and stimulated emission can be accomplished by reversing the roles of the contacts to provide a higher current or tuned cavity in one set of arms and suppression in the others.

In accordance with the invention, a semiconductor crystal structure is provided with groups of in-line ohmic contacts to one conductivity type region and a unipotential opposite conductivity type region separated by a broad PN junction so that light output direction may be made by the appropriate application of potentials to combinations of the ohmic contacts, to the one extrinsic conductivity type region while the unipotential region is held at a reference potential.

Figure 6:
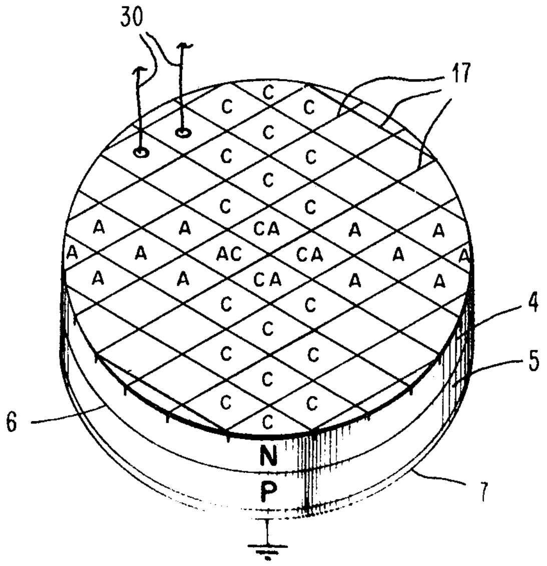
FIG. 6 is a further illustration of the directionality of light output of a device embodying the principles of the invention.

Referring next to FIG. 6, the principle of having a plurality of ohmic contacts to one conductivity type region and a unipotential connection to another conductivity type region is employed to provide a mesh of regions each connected by a single ohmic contact, several of which are shown illustratively as elements 30 and each segment of the mesh is separated by grooves 17 previously described. It will now be apparent to one skilled in the art that when appropriate signals are applied so that all individual regions of the mesh labelled C are forward biased and all others reverse biased, injection across the PN junction 6 is confined to the axis comprised of these elements and an external radiation pattern that is strong along this direction will occur. In order to shift the direction of the beam, a new set of mesh elements, such as those labelled A, can be forward biased with all others reverse biased. Such a beam switching element can then be used for rapid scanning or a multiposition switch. When this device is used as an injection laser, the boundary mirrors would be confocal segments of the cylindrical surfaces shown. Certain items such as laser cavity dimension fabrication techniques well known in the art, have not received extensive discussion, but in order to permit one skilled in the art to have a starting place in this technology, the following set of actual physical dimensions related to a particular material are provided for the device illustrated in FIG. 1, although it will be apparent to one skilled in the art that many sets of particular specifications will be readily apparent in the light of the above teaching of the principles of the invention.

The device to be described operates as an injection laser and is made up of a body 1 of GaAs semiconductor material. In order to provide a minimum of carrier traps monocrystalline material with few crystalline imperfections is employed. The material GaAs is chosen for its particularly high electrical-to-optical conversion efficiency, although with the present study of semiconductor materials, new high efficiency electrical-to-optical conversion materials are being investigated constantly and new members such as InP and InSb are becoming available. The distance 10 between the ohmic contacts 8 and 9 is 0.005 inch. The vertical dimension between the surface 2 and the PN junction 6 defining the N region 4 is 0.003 inch and the vertical dimension between the surface 3 and the PN junction 6 defining the P region 5 is 0.001 inch. The ohmic contact 7 may be plated nickel or gold or an alloy such as solder. The doping in the N rgeion 4 may be $10^{17}$ to $10^{19}$ impurities per CC and the average impurity density in the P region 5 may be $10^{19}$ impurities per CC. In order to provide good injection efficiency at the PN junction 6 a higher impurity density in the P region 5 is good practice.

It will also be apparent to one skilled in the art that the principles of the invention, namely the providing of means to establish a difference of potential on one side of a junction and to retain the other side of the junction unipotential may involve many parameters, all of which have a relative bearing with respect to each other. For example, a difference in impurity concentration in one region with respect to the impurity concentration in the other, may be employed, although there are limits on the use of this method of control that are imposed because of injection efficiency of carriers arcross the PN junction. There are physical dimension controls such as the relative thickness of the N region vs. the P region, and there are physical separation controls such as the difference between the ohmic contacts and the cross-section area of the N region as illustrated in FIGS. 2 and 3. In the above set of specifications, a difference of impurity concentration difference was used as far as good injection efficiency would permit and then a difference in physical region thickness. So long as the parameters employed operate to cause a difference in carrier injection over the junction area the requirements of the invention was met.

What has been described is an improved solid state electro-optical device, wherein the control of light production in the device and the direction of that light is accomplished by the internal crystalline parameters of the device itself.

While the invention has been particularly shown and described with reference to a preferred embodiment thereof, it will be understood by those skilled in the art that various changes in form and details may be made therein without departing from the spirit and scope of the invention.

What is claimed is:

1. In an injection laser device of the type which includes a body of semiconductor material having a first region of one conductivity type, a second region of opposite conductivity type, and a continuous P-N junction extending between said first and second regions, the improvement comprising in combination;

(a) means including a contact connected to said first region for applying a voltage at the portion of said first region adjacent said junction;

(b) a plurality of individual, spaced contacts connected to said second region;

(c) means for applying a voltage of a first polarity to at least a first one of said contacts to said second region to forward bias said junction in the vicinity of said first contact and produce lasing in a cavity along said junction;

(d) and means for applying a voltage of opposite polarity to at least a second one of said contacts to said second region to reverse bias at least a portion of said junction adjacent said second contact and to quench said lasing along said junction at least in the vicinity of said second contact.

2. The injection laser device of claim 1 wherein said first and second contacts extend parallel to each other along one surface of said body, said lasing is produced in a cavity along said junction extending parallel to said first contact, and said reverse bias applied by said second contact confines the cavity along which said lasing is produced.

3. The injection laser device of claim 1 wherein said first contact extends in a first direction along one surface of said body, said second contact extends in the same direction essentially parallel to said first contact on one side of said first contact, and said device includes a third contact extending in said first direction on the other side of said first contact, and said means for applying said voltage of opposite polarity includes means for applying a voltage of opposite polarity to said third contact to reverse bias the portion of said junction in the vicinity of said third contact.

4. The injection laser device of claim 1 in which said voltage of one polarity is applied to a plurality of said individual contacts including said first contact to said second region to produce lasing along a line determined by the location of said contacts;

and said voltage of opposite polarity is applied to a plurality of contacts on said contacts including said second contact to confine said lasing to said line determined by the location of said contacts to which said forward bias is applied.

5. In an injection laser device of the type which includes a body of semiconductor material having a first region of one conductivity type, a second region of opposite conductivity type, and a P-N junction extending between said first and second regions, the improvement comprising in combination;

(a) means for forward biasing at least a portion of said junction to produce lasing in a cavity along that portion of said junction;

(b) and means for modulating the cavity in which said lasing is produced by reverse biasing another portion of said junction adjacent said first portion.

6. The injection laser device of claim 5 wherein said means for modulating includes means for reverse biasing portions of said junction on either side of said cavity in which said lasing is produced.

7. In an injection laser device of the type which includes a body of semiconductor material having a first region of one conductivity type, a second region of opposite conductivity type, and a P-N junction extending between said first and second regions, the improvement comprising in combination:

(a) means including a contact connected to said first region for applying a voltage at the portion of said first region adjacent said junction;
(b) a plurality of individual, spaced contacts connected to said second region;
(c) means for selectively applying a voltage of a first polarity to a selected group of said contacts to said second region to forward bias said junction in the vicinity of said contact and producing lasing along said junction in a direction determined by the location of said contacts;
(d) and means for applying a voltage of opposite polarity to another group of said contacts to said second region to confine said lasing to said direction.

8. In an injection laser device of the type which includes a body of semiconductor material having a first region of one conductivity type and a second region of opposite conductivity type and a P-N junction extending between said first and second regions, the improvement comprising in combination:

(a) means including a contact connected to said first region for applying a voltage to the portion of said first region adjacent said junction;
(b) a plurality of individual, spaced contacts connected to said second region;
(c) and means for selectively producing lasing in different directions along said junction comprising means for applying signals of a first polarity selectively to different groups of contacts to said second region to forward bias said junction in the vicinity of said contacts to which said signals are applied and produce lasing in a cavity extending along said junctions in a direction determined by the location of the group of contacts to which the forward biasing signals are applied.

9. The injection laser device of claim 8 including means for applying reverse biasing signals to other contacts to said second region to confine said lasing to said cavity extending in the direction determined by the group of contacts to which the forward bias signals are applied.

10. In an injection laser device of the type which includes a body of semiconductor material having a first region of one conductivity type, a second region of opposite conductivity type, and a P-N junction extending between said first and second regions, the improvement comprising in combination;

(a) means for forward biasing at least a portion of said junction to produce lasing in a cavity along that portion of said junction and a light output from said laser device;
(b) and means for modulating the light output of said laser device by reverse biasing another portion of said junction adjacent said first portion.

References Cited

UNITED STATES PATENTS

| | | | |
|---|---|---|---|
| 3,257,626 | 6/1966 | Marinace et al. | 331—94.5 |
| 3,290,539 | 12/1966 | La Morte | 331—94.5 |

ALFRED L. BRODY, Primary Examiner

U.S. Cl. X.R.

307—312; 250—199; 331—94.5